United States Patent [19]

Eyuboglu

[11] Patent Number: 5,263,051
[45] Date of Patent: Nov. 16, 1993

[54] DEVICE AND METHOD OF INTERLEAVING FOR A TRELLIS PRECODING SYSTEM

[75] Inventor: M. Vedat Eyuboglu, Boston, Mass.

[73] Assignee: Codex Corporation, Mansfield, Mass.

[21] Appl. No.: 726,069

[22] Filed: Jul. 5, 1991

[51] Int. Cl.$^5$ .............................................. H04B 1/10
[52] U.S. Cl. ........................................ 375/34; 375/58; 371/43
[58] Field of Search ........................ 375/17, 34, 37, 39, 375/60, 7, 8, 94, 101, 58; 371/43, 44, 45

[56] References Cited

U.S. PATENT DOCUMENTS

| | | | |
|---|---|---|---|
| 4,833,693 | 5/1989 | Eguboglu | 375/34 |
| 4,922,507 | 5/1990 | Simon et al. | 375/34 |
| 4,945,549 | 7/1990 | Simon et al. | 371/43 |
| 5,023,889 | 6/1991 | Divsalar et al. | 375/34 |
| 5,029,185 | 7/1991 | Wei | 375/34 |

OTHER PUBLICATIONS

"Channel Coding with Multilevel/Phase Signals", by Gottfried Underboeck, IEEE Transactions on Information Theory, vol. IT-28, No. 1, Jan. 1982, pp. 55-66.

"Coset Codes-Part I: Introduction and Geometrical Classification" by G. David Forney, Jr., IEEE Transaction on Inhibition Theory, vol. 34, No. 5, Sep. 1988, pp. 1123-1151.

"Detection of Coded Modulation Signals on Linear, Severely Distorted Channels Using Decision-Feedback Noise Prediction with Interleaving," by M. Vedat Eyuboglu, IEEE Transactions on Communications, vol. 36, No. 4, Apr. 1988, pp. 401-409.

"Reduced-State Sequence Estimation for Coded Modulation on Intersymbol Interference Channels", by M. Vedat Eyuboglu and Shahid U. H. Qureshi, IEEE Journal on Selected Areas in Communications, vol. 7, No. 6, Aug. 1989, pp. 989-995.

"Coset Codes for Partial Response Channels; or, Coset Codes with Spectral Nulls", by G. David Forney, Jr., and A. R. Calderbank, IEEE Transactions on Information Theory, vol. 35, No. 5, Sep. 1989, pp. 925-943.

"New Automatic Equaliser Employing Modulo Arithmetic", by M. Tomlinson, Electronics Letters, vol. 7, Nos. 5/6, Mar. 25, 1971, pp. 138-139.

"Baseband Line Codes Via Spectral Factorization", by A. R. Calderbank and J. E. Mazo, IEEE Journal on Selected Areas in Communications, vol. 7, No. 6, Aug. 1989, pp. 914-928.

"Trellis Shaping", by G. David Forney, Jr., IEEE Transactions on Information Theory, Aug. 1991, pp. 1-48.

"Trellis Precoding: Combined Coding, Precoding and Shaping for Intersymbol Interference Channels", by M. Vedat Eyuboglu and G. David Forney, Jr., IEEE Transactions on Information Theory, Jun. 1990, pp. 1-44.

"Matched-Transmission Technique for Channels With Intersymbol Interference", by Hiroshi Harashima and Hiroshi Miyakawa, IEEE Transactions on Communications, vol. Com-20, No. 4, Aug. 1972, pp. 774-780.

*Primary Examiner*—Curtis Kuntz
*Assistant Examiner*—Young Tse
*Attorney, Agent, or Firm*—Darleen J. Stockley

[57] ABSTRACT

A device (400) and method (1200) include interleaved trellis precoding to provide a low probability of error in the presence of bursty noise. The use of interleaving and shaping, particularly in a trellis precoded system, provide for improved burst error bit correction.

35 Claims, 6 Drawing Sheets

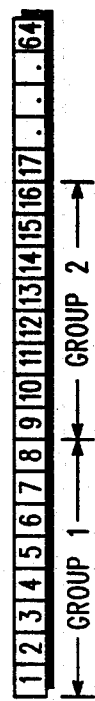
FIG.1A — PRIOR ART —
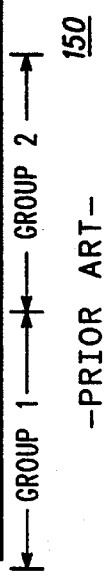
FIG.1B — PRIOR ART —
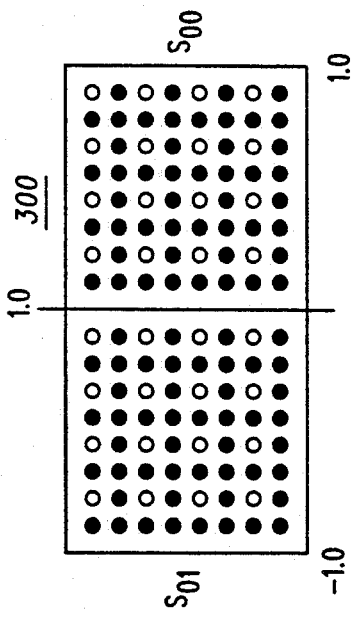
FIG.3
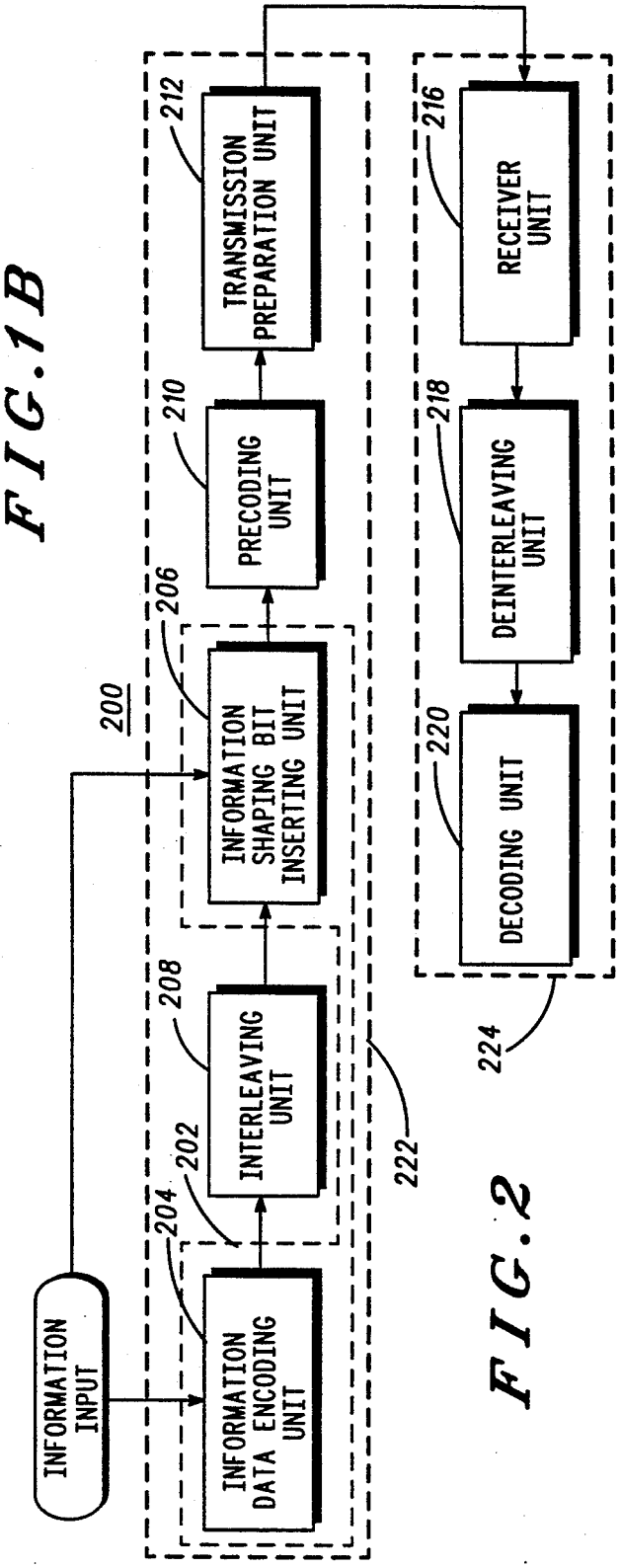
FIG.2

DEVICE AND METHOD OF INTERLEAVING FOR A TRELLIS PRECODING SYSTEM

FIELD OF THE INVENTION

This invention relates generally to digital communication system information encoding and decoding, and more particularly to encoding and decoding of digital communication information utilizing interleaving.

BACKGROUND OF THE INVENTION

Trellis coding is a technique for improving the random noise immunity of a data transmission device by increasing the distance between possible signal sequences without increasing their average power. Trellis coding is widely used in voiceband data modems. Shaping is a technique that can improve random noise immunity by an additional 1.53 dB beyond what is achievable with coding.

Voiceband modems also use equalizers to combat the effects of amplitude distortion, another major impairment that can reduce reliability. Tomlinson precoding is an effective transmit equalization technique that compensates for amplitude distortion.

Recently a technique called trellis precoding was described that effectively combines coding, shaping, and precoding, providing their benefits in a joint manner. That technique allows the transmission device to operate near the theoretical limits of the transmission channel.

Transmission systems can also be impaired by transient noise phenomena such as impulse noise. Impulse noise is often due to switching equipment, but also can be caused by bit slips in digital transmission systems. When the impulses last several symbols, such noise phenomena is known as burst noise. Coded systems can resist burst noise if the effective span of the code is longer than the duration of the burst. Increasing the span of the code often requires high complexity. Thus, in practice, a device known as a deinterleaver has been utilized to reduce the duration of noise bursts. A deinterleaver can scramble the noise signal so that burst noise appears to a decoder as random. In order to preserve an order of an information signal, an interleaver in the transmitter performs an inverse operation. A combined effect of utilizing the interleaver and the deinterleaver is a pure delay.

Since interleaving destroys a certain structure of a shaping system, thus making reconstruction of a signal at a receiver impossible. With present techniques, interleaving cannot be applied to a trellis precoding system to achieve appropriate results. There is a need for a device and method for an interleaving system that randomizes bursty noise in a trellis precoding system without destroying the shaping structure.

SUMMARY OF THE INVENTION

A device and method are included for utilizing interleaving in trellis precoding, the device comprising at least one of: a modulation unit for at least modulating information data input that consists of at least information coding bits and information shaping bit(s) using information symbols; and a demodulation unit for at least demodulating received information symbols to detect modulated information data; wherein: the modulation unit comprises at least: an encoding unit, operably coupled to the information data input and having at least an information data encoding unit and, where desired, is utilized, information shaping bit inserting means, wherein the information data encoding unit is utilized for converting information coding bits into encoded symbols and the information shaping bit inserting unit at least provides altered, where desired, information shaping bit(s); an interleaving unit, operably coupled to the information encoding unit, for selectably interleaving the encoded symbols, further comprising that, where desired, the information shaping bit inserting unit is operably coupled to the interleaving unit for modifying the interleaved encoded symbols using the altered, where desired, information shaping bit(s) to provide modified, interleaved, encoded symbols; a precoding unit, operably coupled to one of: the information shaping bit inserting means and the interleaving means, for utilizing the modified where desired, interleaved, encoded symbols to generate precoded, interleaved, encoded information symbols for transmission; and the demodulation means comprises at least: a receiving unit for receiving precoded, interleaved, encoded information symbols and, where desired, a receiver filtering unit for generating filtered (where desired), received information symbols; a deinterleaving unit, operably coupled to one of: the receiving unit and the receiver filtering unit, for selectably deinterleaving filtered (where desired), received information symbols to obtain selectably deinterleaved, filtered (where desired), received information symbols, termed a channel output symbol; and a decoding unit, operably coupled to the deinterleaving unit, for decoding the channel output symbol to obtain an estimated information data sequence and, where desired, synchronized estimated information shaping bit(s) for a selected information data input. The demodulation unit substantially operates in a reverse manner to that of the modulation unit.

BRIEF DESCRIPTION OF THE DRAWINGS

FIGS. 1A and 1B are schematic representations of an uninterleaved sequence of symbols and an interleaved sequence of symbols, repsectively, as is known in the art.

FIG. 2 illustrates a first embodiment of a device for interleaving in a trellis precoding system in accordance with the present invention.

FIG. 3 is an exemplary representation of a 128 point signal constellation S that consists of two 64-point constellations $S_{00}$ and $S_{01}$ in quadrants 1 and 2, respectively, utilized in an embodiment of the present invention.

DETAILED DESCRIPTION OF A PREFERRED EMBODIMENT

Figure 4:
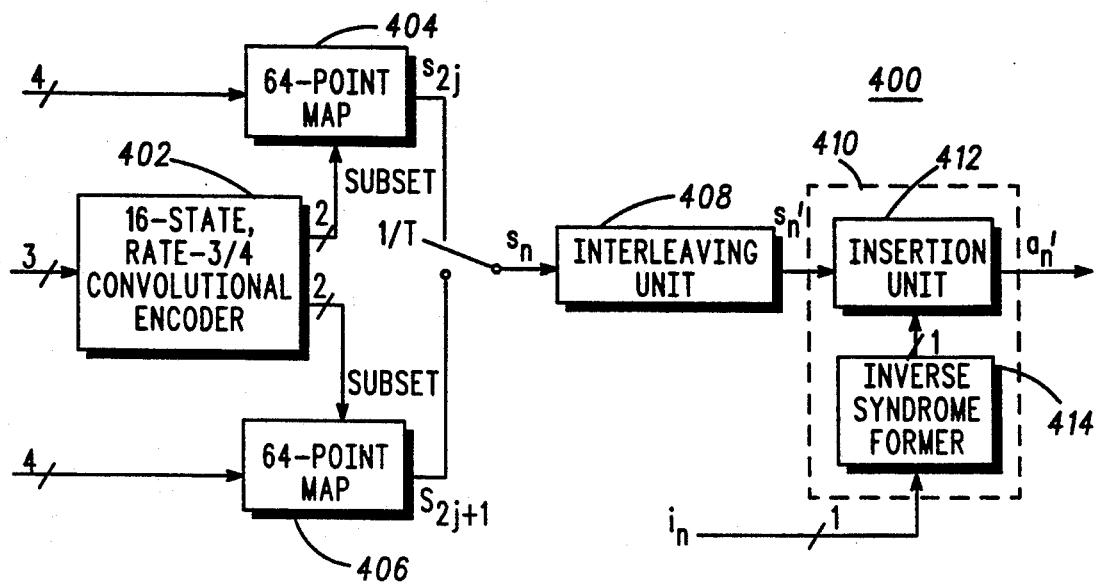
FIG. 4 illustrates an exemplary embodiment of an encoding unit together with an interleaving unit of a device with interleaved trellis precoding in accordance with the present invention.

Generally stated, the device and method of the present invention provide for incorporation of at least interleaving and trellis precoding in a digital communication system such that error probability is reduced in the presence of bursty noise. In a telephone network, noise is typically bursty.

Interleaving is a method similar to shuffling cards to distribute an ordered portion containing cards of one kind throughout an entire deck. In a digital communication system, interleaving breaks up bursty noise into short sections and makes it appear random, making correction easier. FIGS. 1A and 1B illustrate the following example of block interleaving: for example, if a block of 64 code symbols were divided into groups of 8 symbols each and then shuffled such that the first of each group sequentially were placed in a first new group, the second of each group were placed in a second new group, and so forth, the following would be obtained: before shuffling, FIG. 1A, numeral 100, consecutive ordering with a burst error occurring in units 7, 8, 9, and 10; after shuffling, FIG. 1B, numeral 150, the burst errors being spread out with one burst error per new group. Thus, interleaving alone can be particularly effective in randomizing degrading effects of bursty noise.

FIG. 2, numeral 200, illustrates a first embodiment of a device for interleaving in a trellis precoding system in a digital communication system in accordance with the present invention. The device of the present invention comprises at least one of: a modulation unit (222), for at least modulating information data input having information data and, where desired, information shaping bit(s), to provide transmission of information symbols, and a demodulation unit (224), for at least demodulating received information symbols such that communicated digital information is determined with a lower probability of error. Clearly, more than a first modulation unit (222) and more than a first demodulation unit (224) may be utilized; alternatively, a particular device may be configured to provide only one of: the first modulation unit (222) and the first demodulation unit (224). Also, a modulation unit of a transmission unit and a demodulation unit of a receiving unit are typically located in different devices.

In a trellis precoding system, information data input may be expressed in terms of shaping bits and coding bits, where the coding bits also include so-called scaling bits, bits that typically do not directly enter a convolutional coding device. For example, in FIG. 4, described more fully below, an 11 bits input into the encoding unit (402, 404, 404) are coding bits.

The first modulation unit (222) comprises at least: an encoding unit (202), operably coupled to an information input and having at least an information data encoding unit (204) and, where desired, an information shaping bit inserting unit (206). The information data encoding unit (204) is utilized for converting information into a selected number of bits to provide encoded symbols. In one embodiment, trellis encoding, generally an efficient coding method, may be utilized. It is clear that there may be more than one bit involved in shaping.

The modulating unit (222) of the device, FIG. 2, further includes at least an interleaving unit (208), operably coupled to the information encoding unit (204), for selectably interleaving encoded symbols, and, where desired, the information shaping bit inserting unit (206) is operably coupled to interleaving unit (208), for modifying the encoded symbols using the altered, where desired, information shaping bit(s) to provide interleaved, encoded symbols. The interleaving unit (208) typically interleaves the encoded symbols according to a predetermined method of interleaving. The interleaving unit (208) is preselectable.

For example, an interleaver requires a low delay and storage. Another class of interleavers, periodic interleavers, typically may be selected to provide such characteristics. (P,D) interleavers, being periodic interleavers having a period P, are configured such that P and (D+1) have no common factor. Utilizing a (P,D) interleaver results in a deinterleaver delay of D, 2D, ..., (P−1)D, and the interleaver delays are $d_n = [(n+1)R](\mod P) D$, where R is a unique integer in a range $1 \leq R < P$ satisfying an equality $[R(D+1)] = P-1 \pmod{P}$ (in symbol intervals). The total delay L through the described interleaver/deinterleaver pair is $L = (P-1)D$ symbol intervals. For example, (5,2) and (5,3) interleavers have delays of 8 and 12, respectively. Illustrated in the table below is an example wherein a (P, D) interleaver as is known in the art, where P=5 and D'=2, is utilized and the following results are obtained:

| Time Index, n | 0 | 1 | 2 | 3 | 4 | 5 | 6 | 7 | 8 | 9 | 10 | 11 | 12 |
|---|---|---|---|---|---|---|---|---|---|---|---|---|---|
| Encoded Sequence | $x_0$ | $x_1$ | $x_2$ | $x_3$ | $x_4$ | $x_5$ | $x_6$ | $x_7$ | $x_8$ | $x_9$ | $x_{10}$ | $x_{11}$ | $x_{12}$ |
| Interleaver Delay | 6 | 2 | 8 | 4 | 0 | 6 | 2 | 8 | 4 | 0 | 6 | 2 | 8 |
| Interleaved Sequence | — | — | — | $x_1$ | $x_4$ | — | $x_0$ | $x_3$ | $x_6$ | $x_9$ | $x_2$ | $x_5$ | $x_8$ |
| Received Sequence | $r_0$ | $r_1$ | $r_2$ | $r_3$ | $r_4$ | $r_5$ | $r_6$ | $r_7$ | $r_8$ | $r_9$ | $r_{10}$ | $r_{11}$ | $r_{12}$ |
| Deinterleaver Delay | 0 | 2 | 4 | 6 | 8 | 0 | 2 | 4 | 6 | 8 | 0 | 2 | 4 |
| Deinterleaved Sequence | $r_0$ | — | — | $r_1$ | — | $r_5$ | $r_2$ | — | $r_6$ | $r_3$ | $r_{10}$ | $r_7$ | $r_4$ |
| Reconstructed Sequence | — | — | — | — | — | — | — | — | $x_0$ | $x_1$ | $x_2$ | $x_3$ | $x_4$ |

FIG. 4, described more fully below, illustrates one exemplary interleaving embodiment of the present invention. The information shaping bit inserting unit (410) operates as described below for FIG. 2.

The information shaping bit inserting unit (206), for an information shaping bit(s) input, $i_n$, performs an inverse syndrome former operation where desired, on the information shaping bit(s) and combines the shaping bit(s), altered, where desired, with the interleaved encoded symbols. Further, the modulation unit (222) of the device for interleaved precoding comprises at least a precoding unit (210), operably coupled to the information shaping bit inserting unit (206), for utilizing the interleaved shaped encoded symbols to generate precoded, interleaved, shaped, encoded information symbols, also termed a first symbol.

For coding, in one embodiment, a 4D (four dimensional) 16-state Wei code is utilized, (See L.-F. Wei, "Trellis coded modulation with multi-dimensional constellations," I.E.E.E. Trans. Inform. Theory, Vol. IT-33, pp. 483–501, 1987) to transmit 19.2 kbits at 2954 symbols/sec, such that, for example, a total number of 7 coded bits per symbol, of which ½ bit per symbol represents a redundancy of coding, are transmitted. Other selected symbol rates may be used. FIG. 3, numeral 300, illustrates a 128 point signal constellation S that consists of two 64-point constellations $S_{00}$ and $S_{01}$ in quadrants 1 and 2, respectively. S is partitioned into four subsets as indicated by different markings, and two coded bits determine a subset. An information shaping bit inserting unit selects between $S_{00}$ and $S_{01}$ by identifying a sign of a first coordinate in two's complement representation, i.e., selecting between a positive coordinate x and its complement $x-1$. Also, in one embodiment, an uncoded system that is substantially equivalent to a trivial trellis code system with one state may be utilized.

FIG. 4, numeral 400, depicts a block diagram of an exemplary generic 16-state, rate-¾, convolutional encoder (402) suitable for utilizing as a encoding unit (402) in the present invention, configured such that two symbols from the 64 point mapping, $S_{00}$, are generated (at 404; at 406). An interleaving unit (408) interleaves the two symbols generated in this way, and, where desired (typically where shaping is utilized), an information shaping bit inserting unit (410) inserts a shaping bit after interleaving. Where shaping is not utilized, for example in Tomlinson precoding, the information shaping bit inserting unit (410) is typically omitted, and the interleaving unit (208) is operably connected to the precoding unit (210).

As illustrated in FIG. 4, every two bauds, 3 information bits enter a rate-¾, 16-state trellis code whose 4 output bits select two subsets for two 2D (two dimensional) points in $S_{00}$. The 4 'uncoded' information bits select a first point $s_{2j}$, and another group of 4 'uncoded' information bits select a second point $s_{2j+1}$, both from the 64 point constellation $S_{00}$ and from the subsets chosen by the coded bits. Every baud, in the case of trellis precoding (see below), an information shaping bit(s) is precoded in an inverse syndrome former (414). The information shaping bit(s), altered where desired (for example, precoded as $t_{n,0}$), is combined with the interleaved, encoded sequence, $s_n'$, to form an encoded, interleaved, modified sequence $a_n'$ (where $a_n' = s_n' - (t_{n,0}, 0)$) for input into the precoding unit (210). Thus, the information shaping bit inserting unit (410), for an information shaping bit(s) input, performs a binary altering, where desired, of the information shaping bit(s) in the inverse syndrome former (414) and utilizes an insertion unit (412) to modify the interleaved encoded symbols using the information shaping bit(s). When an embodiment in which precoding (see later description) with a trellis code is employed, the inverse syndrome former (414) typically utilizes binary operations in the information shaping bit inserting unit (410). In one embodiment, for Tomlinson precoding (see later description), there is no shaping gain, allowing omission of the inverse syndrome former (414), or, alternatively, the omission of the information shaping bit inserting unit (410). In the latter case, the encoded interleaved, modified sequence $a_n'$ is equal to $s_n'$.

Figure 5:
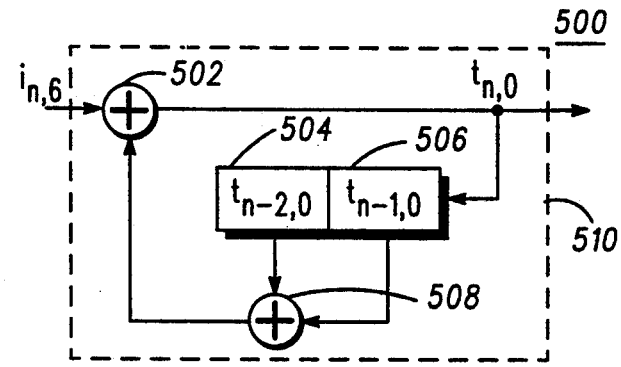
FIG. 5 illustrates an exemplary embodiment of an inverse syndrome former unit of a device with interleaved trellis precoding in accordance with the present invention.

FIG. 5, numeral 500, illustrates an exemplary embodiment of an inverse syndrome former unit (510) of a device in accordance with the present invention. The exemplary embodiment utilizes a first summer (502) to add input information shaping bit(s) to a sum of two immediately preceding successive input information shaping bit(s) (504, 506) obtained utilizing a second summer (508). Typically the summer is implemented with an exclusive OR.

Figure 6:
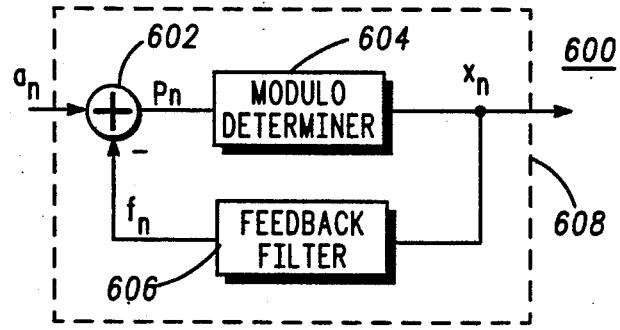
FIG. 6 illustrates an exemplary embodiment of a Tomlinson precoding unit of a device with interleaved precoding in accordance with the present invention.
Figure 7:
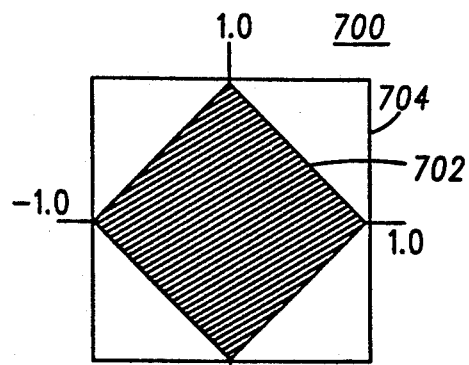
FIG. 7 is a schematic representation of a 45° rotated square region (shaded) for a modulo determiner that reduces precoded symbols in accordance with the present invention.

FIG. 6, numeral 600, illustrates an exemplary embodiment of a Tomlinson precoding unit (608) of a device with interleaved precoding in accordance with the present invention. Previously encoded symbols $x_{n-k}$, $k=1, 2, 3, \ldots, K$, are passed through a feedback filter (606) providing a feedback signal $$f_n = \sum_{1 \leq k \leq K} x_{n-k} h_k,$$

where $h_k$ is an impulse response of a discrete-equivalent channel to be equalized, typically determined by doing modem training in the receiver and subsequently passed to the transmitter during modem training. A precoder combiner (602), typically an adder, subtracts the feedback signal $f_n$ from the input symbol $a_n$ to form $p_n = a_n' - f_n$. A modulo determiner (604) provides encoded symbols relative to a 2D lattice $\Lambda = RZ^2$ configured such that, for a $p_n$ input to the modulo determiner (604), an output is substantially $x_n = a_n' - f_n - c_n = p_n - c_n$, where $c_n$ is a symbol from $\Lambda = RZ^2$ that is closest (in Euclidean distance) to $p_n$, minimizing an instantaneous energy $|x_n|^2$ of the precoded symbol without delay. The modulo determiner (604) substantially reduces precoded symbols to a 45° rotated square region (shaded) (702), illustrated in FIG. 7, numeral 700, (where a larger square (704) is a boundary in the case of shaping) to reduce signal peaks, wherein a normalized average energy of the precoded symbol has substantially the same energy as that of a 128-point quadrature amplitude modulated (QAM) signal constellation with a square boundary (702).

Trellis coding is a method of increasing distances between symbols of a signal constellation such that symbols likely to be confused are separated by maximized distances, while substantially not increasing average power. Shaping, a method of reducing the energy of encoded symbols, may be utilized to provide shaping gain such that more noise can be handled with a same transmit power.

Figure 8B:
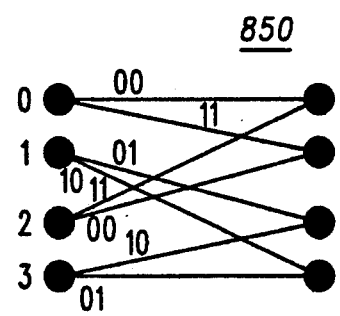
FIG. 8B is a schematic representation of an exemplary trellis code T diagram showing all sequences whose subset labels {$b_n$} belong to a 4-state rate-$\frac{1}{2}$ convolutional code C.
Figure 8A:
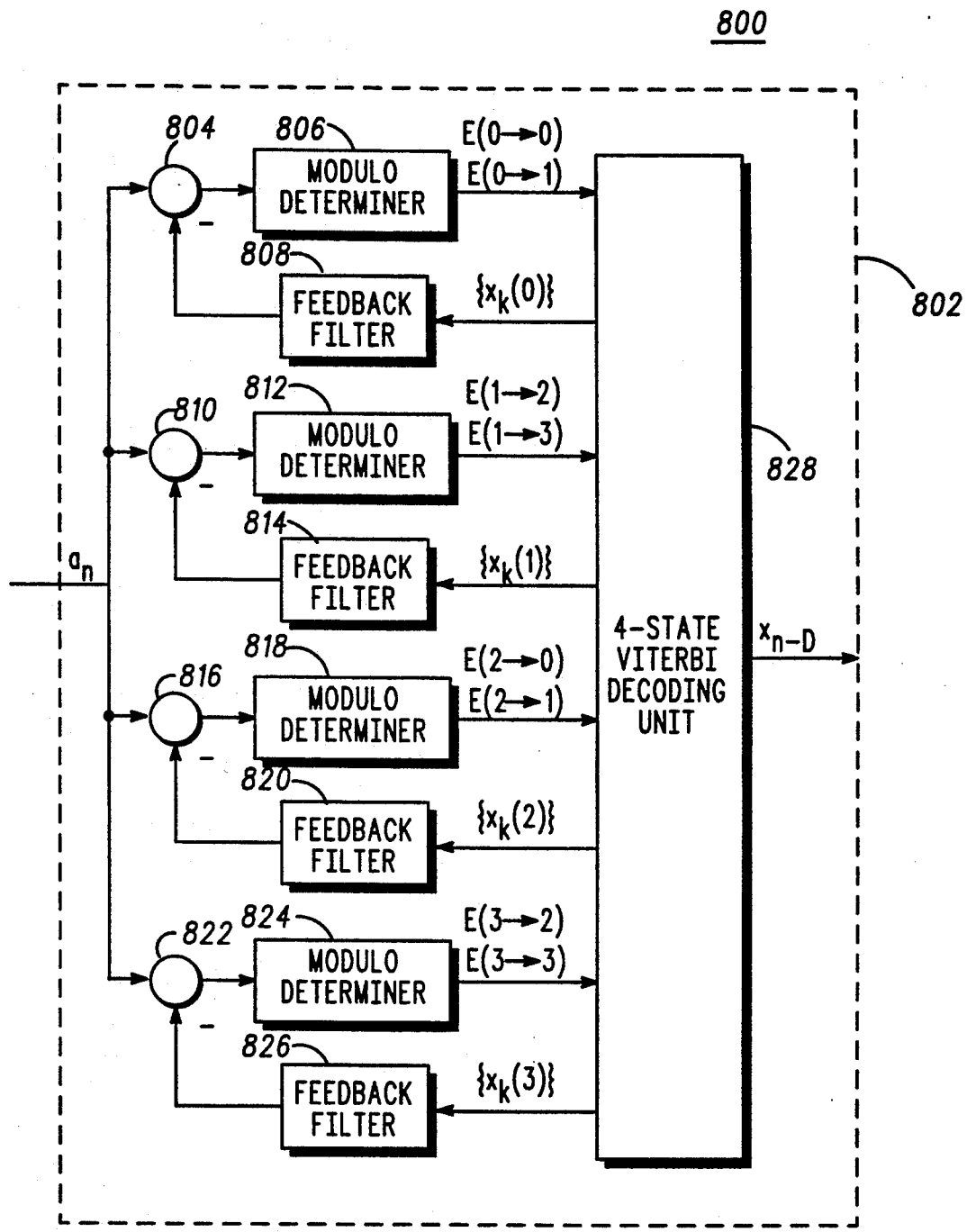
FIG. 8A illustrates an exemplary embodiment of a trellis precoding unit of a device with interleaved precoding in accordance with the present invention.

FIG. 8A, numeral 800, illustrates an exemplary embodiment of a trellis precoding unit in accordance with the present invention. The trellis precoding unit is configured to utilize a modulo determiner on a sequence basis with respect to a trellis code T to determine $x_n = p_n - c_n$, $c_n$ being a sequence in C such that the precoded symbols $x_n$ have a small average energy. (Obtaining the sequence $c_n$ necessarily invokes some delay.) For example, about 0.7–0.9 decibels of shaping gain may be obtained with a simple 4-state 2D Ungerboeck code. Shaping gain depends on the response of the feedback (prediction) filter h(D), but only slightly. Required delay in this example is 6-10 symbols. The symbols of the trellis code T lie on an integer lattice $Z^2$, the symbols belonging to one of 4 subsets that are represented by a two bit subset label $b_n$. The exemplary trellis code T consists of all sequences whose subset labels $\{b_n\}$ belong to a 4-state rate-$\frac{1}{2}$ convolutional code C whose trellis diagram is set forth in FIG. 8B, numeral 850.

In trellis precoding the modulo determination is implemented using a Viterbi algorithm (VA), wherein inputs to the VA are encoded symbols $a_n'$, and outputs are precoded symbols $x_{n-D}$. The VA searches for a code sequence $\{c_n\}$ from C such that an average energy of $x_n = a_n' - p_n - c_n$ is minimized. At any given time, the VA has in storage four path histories (candidate paths) $\{x_k(i)\}$, $i=0,1,2,3$ with $k<n$, where each path is associated with a different state of the convolutional code. The VA also has in storage, as path metrics, a total energy (E) of each path, accumulated up to time n:

$$E(i) = \sum_{k<n} |x_k(i)|^2.$$

When a new encoded symbol $a_n'$ arrives, the VA extends each candidate path into two possible directions according to the trellis diagram being implemented (the trellis diagram set forth above for the exemplary embodiment) and increments each path metric.

Specifically, for a branch (i->j) from state i to state j, a path metric is incremented according to:

$$E(i\rightarrow j) = E(i) + |a_n' - \sum_{1\leq k\leq K} x_{n-k(i)} h_k - c_n(i\rightarrow j)|^2$$

where $c_n(i\rightarrow j)$ is a symbol in a subset associated with a branch (i->j) that minimizes a value of E(i->j), the VA retaining only a path that has a smallest path metric, and updating path history accordingly. For example, if for new state j the path that comes from old state i has a smallest metric, then the new path history of state j will be the old path history of state i, with a new symbol $$|a_n' - \sum_{1\leq k\leq K} x_{n-k(i)} h_k - c_n(i\rightarrow j)|$$

appended.

After completion of the above steps, the VA determines a state j that has a smallest total energy and releases an oldest symbol $x_{n-D}(j)$ from its path history as a precoded symbol, where D is delay. To ensure that an ultimately selected sequence $\{c_n\}$ is a legitimate sequence from trellis code T, the VA assigns very large path metrics to all paths that are not a continuation of the most recently released symbol.

As illustrated in FIG. 8A, numeral 800, in the exemplary embodiment, a trellis precoding unit utilizing the VA (802) effectively has one Tomlinson precoder (804, 806, 808; 810, 812, 814; 816,818,820; 822,824,826) for each state of the trellis code that work in parallel, each using feedback from its own path history. Where the delay in the VA of the 4 state Viterbi decoding unit (828) is zero, the trellis precoding unit has a complexity and performance of a Tomlinson precoding unit, operating on a symbol by symbol basis yielding precoded symbols within a square boundary of side square root of two and with essentially a uniform probability density so that for every baud only one precoding filter is necessary. Where the delay is non-zero, shaping gain is obtained, and precoded symbols will have a square boundary of length two and a probability density resembling a truncated Gaussian density. In other embodiments trellis precoding may be implemented utilizing a decoder that is other than the Viterbi type.

As illustrated in FIG. 2, the precoded symbols, a first symbol, may be passed through at least a transmission preparation unit (212), where desired, typically simply a pulse-shaping filter unit appended to a digital-to-analog converter unit and an analog filter unit, operably connected to the precoding unit, configured to generate shaped signal samples. The present invention may be implemented without utilizing a transmission preparation unit in selected applications.

FIG. 2 further illustrates the at least first demodulation unit (224) comprising: at least a receiver unit (216), and, where desired, a receiver filtering unit (not shown) being typically adaptive, for receiving information symbols to generate filtered (where desired), received information symbols; a deinterleaving unit (218), operably coupled to one of: a receiving unit (216) and the receiver filtering unit, for selectably deinterleaving filtered (where desired), received information symbols to obtain selectably deinterleaved, filtered (where desired), received information symbols; and a decoding unit (220), operably coupled to the deinterleaving unit, for decoding the symbols to obtain estimated information coding bits and synchronized estimated information shaping bit(s) for a selected information data input.

The receiver filtering unit may be implemented in one embodiment as an adaptive linear equalizer followed by a prediction filtering unit (not shown) with an impulse response $\{h_k\}$ that can be combined into a single receiver filter. Output $r_n$ of the receiver filtering unit typically has a form:

$$r_n = a_n' - c_n + w_n = s_n' - (t_{n,0}, 0) - c_n + w_n = y_n + w_n$$

where $w_n$ is a distortion sequence, $c_n$ is a code sequence from a shaping trellis code, and $y_n = s_n' - (t_{n,0}, 0) - c_n$ is substantially a noise-free desired signal. The deinterleaving unit (218) utilizes an inverse interleaving to that utilized in the interleaving unit (208) to provide a deinterleaved output $r_n'$, where $r_n' = s_{n-L} - (t_{n,0}', 0) - c_n' + w_n' = y_n' + w_n'$, where L is a total delay in the interleaving unit/deinterleaving unit, and $r_n'$ is input into the decoding unit (220). Clearly, the shaping sequence $\{c_n\}$ and the shaping bit sequence $\{t_{n,0}\}$ are shuffled. The distortion sequence $\{w_n\}$ is also randomized as described above, aiding the receiver decoding unit (902). However, the original encoded sequence $\{s_n\}$ is not shuffled. Also, the desired sequence $\{y_n'\} = \{s_{n-L} - (t_{n,0}', 0) - c_n'\}$ is still a valid code sequence from the Wei code, even though $\{c_n'\}$ is not a valid sequence from the shaping code C. Thus, the decoding unit operates as usual to find an estimate $y_n'$.

Figure 9:
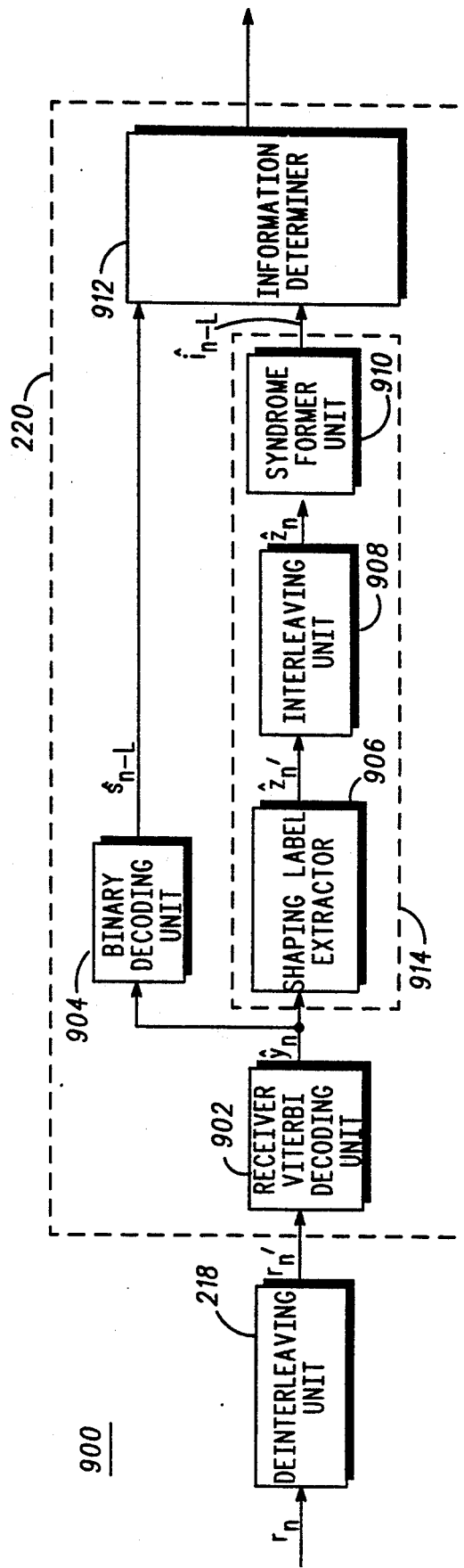
FIG. 9 illustrates an embodiment of a deinterleaving unit and a decoding unit of a device with interleaved trellis precoding in accordance with the present invention.

FIG. 9 illustrates an embodiment of a deinterleaving unit (218) and a decoding unit (220) of a device with interleaved precoding in accordance with the present invention. The decoding unit (220) typically includes: a receiver Viterbi decoding unit (VA)(902), operably coupled to the deinterleaving unit (218), for decoding received deinterleaved signals; an information shaping bit determiner (914), operably coupled to the Viterbi decoding unit (902), for determining an estimated delayed information shaping bit sequence; a binary decoding unit (904), operably coupled to the receiver Viterbi decoding unit (902), for substantially determining estimated delayed information coding bits for received information symbols; and an information determiner (912), operably coupled to the information shaping bit determiner (914) and to the binary decoding unit (904), for substantially determining estimated desired, substantially distortion-free information data. The information shaping bit determiner (914) is operably coupled to the receiver Viterbi decoding unit and typically comprises at least: a shaping label extractor (906), operably coupled to the receiver Viterbi decoding unit (902), for determining a shaping label sequence of a received deinterleaved signal, an interleaving unit (908), operably coupled to the shaping label extractor (906), for interleaving the shaping label sequence; and, where desired, a syndrome former unit (910) operably coupled to the interleaving unit (908), for providing an estimated information shaping bit sequence. The estimated desired, substantially distortion-free information signal is substantially determined in an information determiner (912) from the delayed estimated information shaping bit sequence $\{i_{n-L}\}$ and the delayed estimated information coding bits $\{s_{n-L}\}$.

The receiver Viterbi decoding unit (902) typically 'folds' a deinterleaved signal $r_n'$ into a square boundary of a signal constellation, decodes the folded point utilizing the VA, and operates to determine, with a predetermined decoding delay, a most likely symbol $y_n''$ from the signal constellation.

Figure 10:
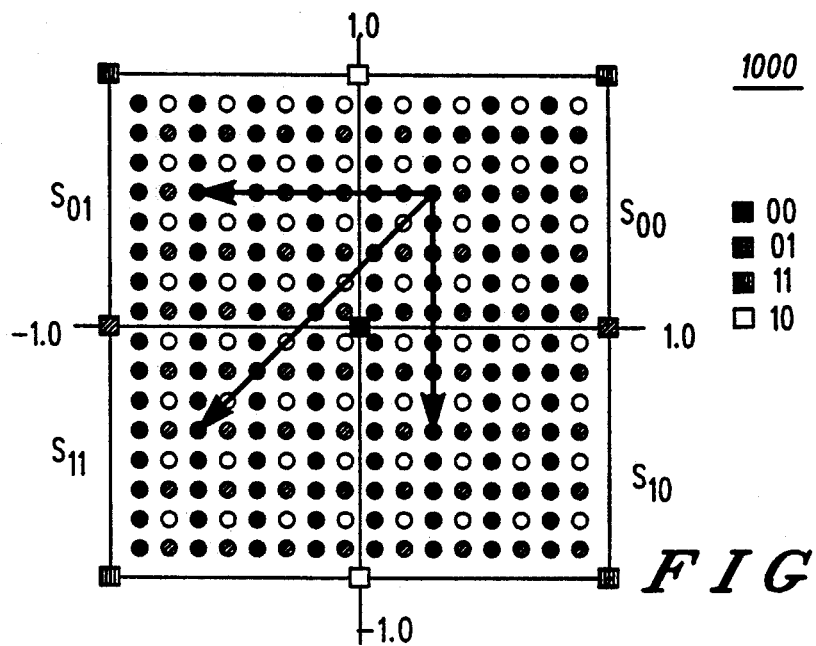
FIG. 10 is an exemplary representation of a 256 point signal constellation S' that consists of four 64-point constellations $S_{00}$, $S_{01}$, $S_{10}$, and $S_{11}$, utilized in an embodiment of the present invention.

For example, where the signal constellation is a 256-point signal constellation S', FIG. 10, numeral 1000, $r_n'$ is 'folded' into the square boundary of S' by reducing its coordinates to an interval $[-1.0, 1.0]$ by a modulo 2 operation, and is decoded according to the VA to obtain $y_n''$ from S'. As shown in the exemplary signal constellation in FIG. 10, where S' is partitioned into four 64-point subconstellations, $S_{00}, S_{01}, S_{11}$ and $S_{10}$, in quadrants 1 through 4, respectively, each subconstellation is labelled by a two bits shaping label. Shaping affects only a shaping bit of the encoded symbol in two's complement representation. Thus, all information bits, except the shaping bit, are determined by first folding $y_n''$ into $S_{00}$ and then using an inverse map.

For example, where the symbol $y_n''$ is correctly estimated, $s_{n-L}$ is recovered by folding $y_n''$ into $S_{00}$ by extracting the information coding bits from the output of the receiver Viterbi decoding unit (902). To recover the information shaping bits $i_{n-L}$, the extracted shaping labels $z_n'$ of the estimate $y_n''$ are passed through the interleaving unit (908), typically the same (through not illustrated) interleaving unit (208) utilized in a transmitter, to obtain a two-bit label, $z_n$. The output of the interleaving unit (908) is passed through the syndrome former (910), where desired (typically where a precoder introduced shaping gain), to the information determiner (912) that substantially determines the estimated desired, substantially distortion free, information signal from the delayed estimated information shaping bit sequence $\{i_{n-L}\}$ and the delayed estimated input symbol sequence sequence $\{s_{n-L}\}$.

Where the Tomlinson precoding system is utilized, the information shaping bit determiner (914) may be omitted.

Figure 11:
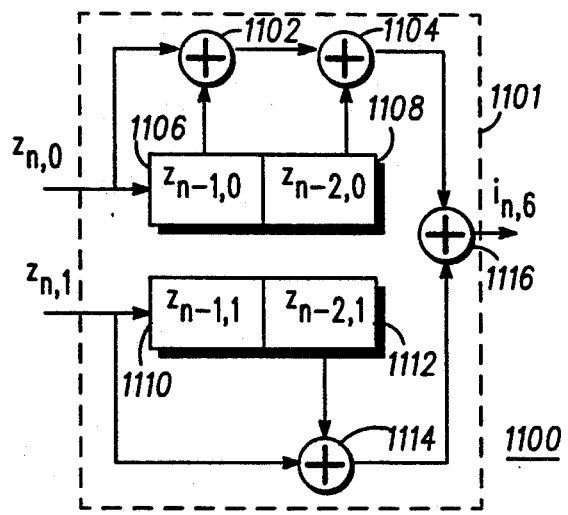
FIG. 11 illustrates an exemplary embodiment of a syndrome former unit of a device with interleaved trellis precoding in accordance with the present invention.

FIG. 11 illustrates an exemplary embodiment of a syndrome former unit (1101) of a device with interleaved precoding in accordance with the present invention. It is clear that $z_n = t_n \oplus b_n$, where $\{b_n\}$ is a sequence from the convolution code C and $t_n = (t_{n,0}, 0)$ is the inverse syndrome former output $t_{n,0}$. A primary first delay unit is operably connected to the interleaving unit (908) output having a primary bit label output, $z_{n,0}$, and to a primary second delay unit (1108). A third summer (1102), operably coupled to the interleaving unit output (906) having the primary bit label output and to the primary first delay unit (1106), sums the received $z_{n,0}$ and a first delayed $z_{n-1,0}$ to provide a first sum. A fourth summer (1104), operably coupled to the third summer (1102) and to the primary second delay unit (1108), sums the first sum and a second delayed $z_{n-1,0}$ to provide a second sum. A secondary first delay unit is operably coupled to the interleaving unit (908) output having a secondary bit label output, $z_{n,1}$, and to a secondary second delay unit (1112). A fifth summer (1114), operably coupled to the interleaving unit output having the secondary bit label output and to the secondary second delay unit (1112) sums the received $z_{n-1,1}$ and a second delayed $z_{n-2,1}$ to provide a third sum. A sixth summer (1116), operably coupled to the fourth summer (1104) and to the fifth summer (1114), sums the second sum and the third sum to provide a delayed estimated information shaping bit sequence, $i_{n-L}$. In a preferred embodiment summer operations are typically exclusive OR operations.

In another embodiment at least one of: the encoding unit; the interleaving unit; the precoding unit; the transmission preparation unit; the receiver filtering unit; the deinterleaving unit; and the decoding unit; may be implemented utilizing a computer program storage medium having a computer program to be executed by a digital computer stored thereon, the computer program comprising at least one of:

first unit for converting information coding bits into encoded symbols and, where desired, the information shaping bit inserting unit for at least providing altered, where desired, information shaping bit(s);

second unit for selectably interleaving the encoded symbols, and for modifying the encoded symbols using the altered, where desired, information shaping bit(s) to provide modified, interleaved, encoded symbols;

third unit for utilizing the modified interleaved, encoded symbols to generate precoded, modified interleaved, encoded symbols, termed a first symbol;

fourth unit for receiving precoded, interleaved, encoded information symbols, to generate filtered, received information symbols;

fifth unit for selectably deinterleaving filtered, received information symbols to obtain selectably deinterleaved, filtered, received information symbols, termed a channel output symbol; and sixth unit for decoding the channel output symbol to obtain estimated information coding bits and, where desired, synchronized estimated information shaping bit(s) for a selected information data input.

In another embodiment at least one of: the encoding unit; the interleaving unit; the precoding unit; the transmission preparation unit; the receiver filtering unit; the deinterleaving unit; and the decoding unit; may be implemented utilizing at least a first digital signal processor configured to provide at least one of:

first unit for converting information coding bits into encoded symbols and, where desired, the information shaping bit inserting unit for at least providing altered, where desired, information shaping bit(s);

second unit for selectably interleaving the encoded symbols, and for modifying the encoded symbols using the altered, where desired, information shaping bit(s) to provide modified, interleaved, encoded symbols;

third unit for utilizing the modified interleaved, encoded symbols to generate precoded, modified interleaved, encoded symbols, termed a first symbol;

fourth unit for receiving precoded, interleaved, encoded information symbols, to generate filtered, received information symbols;

fifth unit for selectably deinterleaving filtered, received information symbols to obtain selectably deinterleaved, filtered, received information symbols, termed a channel output symbol; and sixth unit for decoding the channel output symbol to obtain estimated information coding bits and, where desired, synchronized estimated information shaping bit(s) for a selected information data input.

Figure 12:
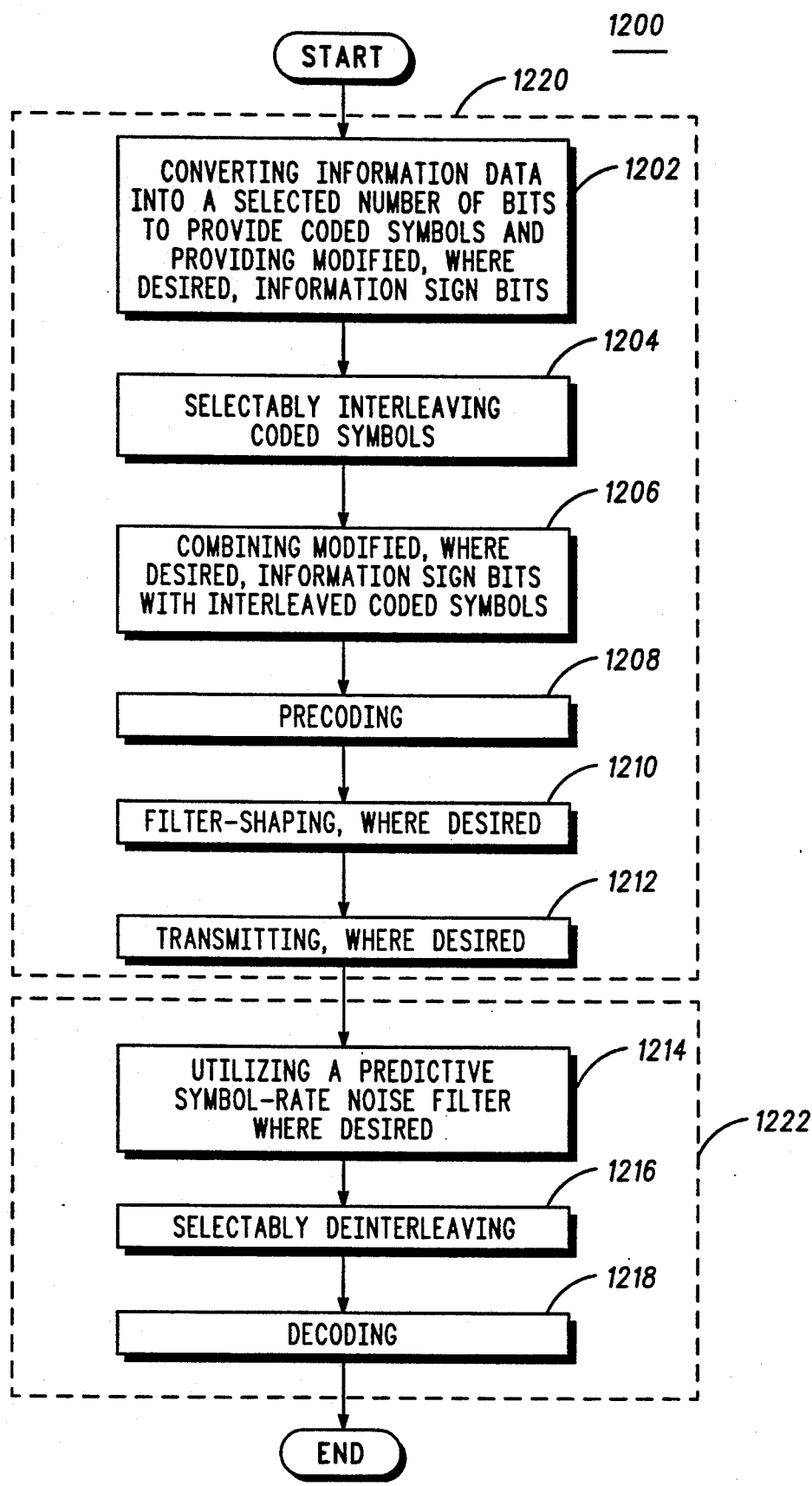
FIG. 12 is a flow diagram of steps of one embodiment of the method of utilizing interleaving for a trellis precoding system in accordance with the present invention.

FIG. 12, numeral 1200, is a flow diagram of steps of one embodiment of the method of utilizing interleaving for a trellis precoding system in accordance with the present invention. The method of the present invention comprises at least one of:

steps for at least modulating and, where desired, transmitting information input having information data and, where desired, information shaping bit(s) (1220); and steps for at least demodulating received information symbols (1222), wherein:

The steps for at least modulating and, where desired, transmitting information comprise at least the steps of: converting information data into a selected number of bits to provide encoded symbols and providing altered, where desired, information shaping bit(s) (1202); selectably interleaving the encoded symbols (1204); modifying the encoded symbols using the altered, where desired, information shaping bit(s) to provide interleaved, encoded symbols (1206); precoding the interleaved encoded symbols to generate precoded, interleaved, encoded information symbols, termed a first symbol (1208); where desired, filter-shaping the first symbol to obtain substantially a shaped symbol (1210); and, where desired, transmitting the symbols (1212).

The steps for at least demodulating received information symbols comprise at least the steps of: utilizing at least a filter, typically a predictive symbol-rate noise filter, to filter received information symbols to generate filtered, received information symbols (1214); selectably deinterleaving filtered, received information symbols to obtain selectably deinterleaved, filtered, received information symbols, termed a channel output symbol (1216); and decoding the channel output symbol to obtain an estimated information data sequence and synchronized estimated information shaping bit(s) for a selected information data input (1218) such that communicated digital information is determined with a low probability of error.

In accordance with the description above, typically the step of converting information data into a selected number of bits to provide encoded symbols includes at least a step of utilizing convolutional encoding, as set forth in more detail above. Also, the step of modifying the encoded symbols using the altered, where desired, information shaping bit(s) to provide interleaved, encoded symbols includes at least a step of utilizing, where desired, an inverse syndrome former to obtain modified information shaping bit(s), then modifying the encoded symbols using the altered, where desired, information shaping bit(s). In one embodiment, the step of precoding the interleaved encoded symbols substantially utilizes Tomlinson precoding, and, in another embodiment, the said precoding step utilizes another trellis precoding method. The step of filtering the first symbol to obtain substantially selected symbols in a desired bandwidth typically includes a step of utilizing at least a pulse shaping filter. The step of utilizing at least a predictive symbol-rate noise filter to filter received information symbols to obtain filtered, received information symbols may be selected to further include a step of utilizing linear equalizing.

The step of decoding the selectably deinterleaved, filtered, received information symbols to obtain, for a selected information data input, an estimated information data sequence and synchronized estimated information shaping bit(s) such that error is substantially minimized typically includes a step of utilizing at least a Viterbi decoder. The step of decoding the channel output symbol typically further includes a step of utilizing a binary decoding unit for substantially determining an estimated information data input symbol sequence for received information symbols. The step of decoding the channel output symbol typically also further includes a step of substantially determining information shaping bit(s), substantially comprising at least the steps of: extracting shaping label(s), interleaving the extracted shaping label(s), and, where desired (typically where shaping gain was obtained), utilizing a syndromeformer, such that estimated information shaping bit(s) of information input are substantially determined.

Clearly the steps of the method of the present invention may be carried out entirely, and alternatively, at least in part, utilizing one of: a computer program stored on a computer medium and at least a first digital signal processor. Also, it is clear that the demodulation unit substantially operates in a reverse manner to that of the modulation unit.

Although exemplary embodiments of the device and method of the present invention are set forth above, it will be obvious to those skilled in the art that many alterations and modifications may be made without departing from the invention. Such modifications may include different trellis codes (e.g., 16-state 2D), different shaping codes (e.g., 8-state 4D), other interleavers (e.g., block), other baseband systems, and the like. Accordingly, it is intended that all such alterations and modifications be included within the spirit and scope of the invention as defined in the appended claims.

I claim:

1. A device for utilizing interleaving in precoding comprising at least one of:

modulation means for at least modulating information data input that comprises at least information coding bits and information shaping bit(s) using information symbols; and demodulation means for at least demodulating received information symbols to detect modulated information data; wherein:

the modulation means comprises at least:

information data encoding means, operably coupled to the information data input, for converting information coding bit(s) into encoded symbols;

interleaving means, operably coupled to the information data encoding means, for interleaving the encoded symbols, and an information shaping bit inserting means, operably coupled to the interleaving means and to the information input to provide altered information shaping bit(s) and for modifying the interleaved encoded symbols using the altered information shaping bit(s) to provide modified, interleaved, encoded symbols;

precoding means, operably coupled to the information shaping bit inserting means, for generating precoded, interleaved, encoded information symbols for transmission over a discrete equivalent channel with an impulse response h(D); and the demodulation means comprises at least:
a receiving means for receiving precoded, interleaved, encoded information symbols;

deinterleaving means, operably coupled to the receiving means, for deinterleaving received information symbols to obtain deinterleaved received information symbols, termed a channel output symbol; and decoding means, operably coupled to the deinterleaving means, for decoding the channel output symbol to obtain an estimated information data sequence and synchronized estimated information shaping bit(s) for representing information data input.

2. The device of claim 1, wherein the shaping bit(s) substantially determine a sign of the encoded symbol.

3. The device of claim 1, wherein the information data encoding means includes at least a trellis encoding means.

4. The device of claim 3, wherein the trellis encoding means comprises a four dimensional, sixteen state encoding means.

5. The device of claim 3, wherein the trellis encoding means utilizes one state encoding.

6. The device of claim 1, wherein the information shaping bit inserting means includes: an inverse syndrome former, where desired, and a modifying unit.

7. The device of claim 1, wherein the precoding means utilizes trellis precoding.

8. The device of claim 1, further including a transmission preparation means for utilizing at least pulse-shaping filtering.

9. The device of claim 1, wherein the receiving means utilizes adaptive linear filtering.

10. The device of claim 1, wherein the decoding means includes at least a Viterbi decoding means.

11. The device of claim 10, the decoding means further including a binary decoding unit, operably coupled to the Viterbi decoding means, for substantially determining estimated information coding bits for received information symbols.

12. The device of claim 11, the decoding means further including an information shaping bit determiner, operably coupled to the Viterbi decoding means, substantially comprising at least:
a shaping label extractor, operably coupled to an interleaving unit that is operably coupled to a syndrome-former for substantially determining estimated information shaping bit(s) of the transmitted information data.

13. The device of claim 1 wherein h(D) is substantially equal to 1.

14. A device in a modem for utilizing interleaving in trellis precoding, comprising at least one of:
modulation means for at least modulating information data input that comprises at least information coding bits and, where desired, information shaping bit(s) using information symbols; and demodulation means for at least demodulating received information symbols to detect modulated information data; wherein:

the modulation means comprises at least:
information data encoding means, operably coupled to the information input, for converting information coding bit(s) into encoded symbols;

interleaving means, operably coupled to the information data encoding means, for interleaving the encoded symbols, and an information shaping bit inserting means operably coupled to the interleaving means and to the information input to provide altered information shaping bit(s) and for modifying the interleaved encoded symbols using the altered information shaping bit(s) to provide modified, interleaved, encoded symbols;

precoding means, operably coupled to the information shaping bit inserting means, for generating precoded, interleaved, encoded information symbols for transmission over a discrete equivalent channel with an impulse response h(D); and the demodulation means comprises at least: receiving means for receiving precoded, interleaved, encoded information symbols;

deinterleaving means, operably coupled to the receiving means, for deinterleaving received information symbols to obtain deinterleaved received information symbols, termed a channel output symbol; and decoding means, operably coupled to the deinterleaving means, for decoding the channel output symbol to obtain an estimated information data sequence and synchronized estimated information shaping bit(s) representing information data input.

15. The device of claim 14, wherein the shaping bit(s) substantially determine a sign of the encoded symbol.

16. The device of claim 14, wherein the information data encoding means includes at least a trellis encoding means.

17. The device of claim 16, wherein the trellis encoding means comprises a four dimensional, sixteen state encoding means.

18. The device of claim 16, wherein the trellis encoding means utilizes one state encoding.

19. The device of claim 14, wherein the information shaping bit inserting means includes: an inverse syndrome former, where desired, and a modifying unit.

20. The device of claim 14, wherein the precoding means utilizes trellis precoding.

21. The device of claim 14, further including a transmission preparation means for utilizing at least pulse-shaping filtering.

22. The device of claim 14, wherein the receiving means utilizes adaptive linear filtering.

23. The device of claim 14, wherein the decoding means includes at least a Viterbi decoding means.

24. The device of claim 23, wherein the decoding means further includes a binary decoding unit, operably coupled to the Viterbi decoding means, for substantially determining estimated information coding bits for received information symbols.

25. The device of claim 24, wherein the decoding means further includes an information shaping bit determiner, operably coupled to the Viterbi decoding means, substantially comprising at least:
a shaping label extractor, operably coupled to an interleaving unit that is operably coupled to a syndrome-former for substantially determining estimated information shaping bit(s) of the transmitted information data.

26. A method for utilizing interleaving in trellis precoding, comprising at least one of:
   steps for at least modulating and transmitting information data input that comprises at least information coding bits and information shaping bit(s), using information symbols; and
   steps for at least demodulating received information symbols, wherein:
      the steps for at least modulating transmitted information comprise at least the steps of:
         converting information coding bits into encoded symbols and providing altered information shaping bit(s);
         interleaving the encoded symbols;
         modifying the interleaved encoded symbols with altered information shaping bit(s) to provide modified, interleaved, encoded symbols;
         precoding the modified, interleaved, encoded symbols to generate precoded, interleaved encoded information symbols; and
      steps for at least demodulating received information symbols comprise at least the steps of:
         generating filtered, received information symbols;
         deinterleaving filtered, received information symbols to obtain deinterleaved, filtered, received information symbols; and
         decoding the deinterleaved, filtered, received information symbols to obtain estimated information coding bits and synchronized estimated information shaping bit(s) representing information data input.

27. The method of claim 26, wherein the shaping bit(s) are substantially sign bit(s) that indicate a sign of a signed information data input.

28. The method of claim 26, wherein the step of converting information data into a selected number of bits to provide encoded symbols includes at least a step of utilizing trellis encoding.

29. The method of claim 28, wherein the step of trellis encoding comprises utilizing four dimensional, sixteen state encoding.

30. The method of claim 28, wherein the step of trellis encoding utilizes one state encoding.

31. The method of claim 26, wherein the step of modifying the interleaved encoded symbols with altered, where desired, information shaping bit(s) to provide interleaved, modified, encoded symbols includes at least a step of utilizing, where desired, an inverse syndrome former to obtain altered information shaping bit(s), then modifying the interleaved, encoded symbols with the altered information shaping bit(s).

32. The method of claim 26, further including a step of utilizing at least pulse shaping filtering for filtering the precoded, interleaved encoded information symbols to obtain substantially selected symbols in a desired bandwidth.

33. The method of claim 26, wherein the step of decoding the deinterleaved, filtered, received information symbols includes a step of at least Viterbi decoding.

34. The method of claim 33, wherein the step of decoding the deinterleaved, filtered, received information symbols further includes a step of utilizing binary decoding for substantially determining estimated information coding bits for received information symbols.

35. The method of claim 34, wherein the step of decoding the deinterleaved, filtered, received information symbols further includes a step of substantially determining information shaping bit(s), substantially comprising at least the steps of: extracting shaping label(s), interleaving the extracted shaping label(s), and utilizing a syndrome-former unit, such that estimated information shaping bit(s) of information input are substantially determined.

* * * * *

UNITED STATES PATENT AND TRADEMARK OFFICE
CERTIFICATE OF CORRECTION

PATENT NO. : 5,263,051

DATED : Nov. 16, 1993

INVENTOR(S) : M. Vedat Eyuboglu

It is certified that error appears in the above-identified patent and that said Letters Patent is hereby corrected as shown below:

At column 14, line 22, "at least: receiving" should be --at least: a receiving--.

Signed and Sealed this

Thirty-first Day of May, 1994

Attest:

BRUCE LEHMAN

Attesting Officer

Commissioner of Patents and Trademarks